(12) United States Patent
Hong et al.

(10) Patent No.: US 7,005,315 B2
(45) Date of Patent: Feb. 28, 2006

(54) METHOD AND FABRICATING COMPLEMENTARY METAL-OXIDE SEMICONDUCTOR IMAGE SENSOR WITH REDUCED ETCH DAMAGE

(75) Inventors: Hee Jeong Hong, Chungcheongbuk-do (KR); Won-Ho Lee, Chungcheongbuk-do (KR)

(73) Assignee: Magnachip Semiconductor, Ltd., (KR)

( * ) Notice: Subject to any disclaimer, the term of this patent is extended or adjusted under 35 U.S.C. 154(b) by 0 days.

(21) Appl. No.: 11/072,772

(22) Filed: Mar. 3, 2005

(65) Prior Publication Data

US 2005/0250240 A1 Nov. 10, 2005

(30) Foreign Application Priority Data

May 6, 2004 (KR) .................... 10-2004-0032007

(51) Int. Cl.
*H01L 21/00* (2006.01)
(52) U.S. Cl. .................... 438/73; 438/527; 438/200
(58) Field of Classification Search ............ 438/48–99, 438/510–532, 141–309
See application file for complete search history.

(56) References Cited

U.S. PATENT DOCUMENTS

| | | | |
|---|---|---|---|
| 6,040,593 A * | 3/2000 | Park ..................... 257/292 |
| 6,194,260 B1 * | 2/2001 | Chien et al. ............. 438/232 |
| 6,635,912 B1 * | 10/2003 | Ohkubo .................. 257/292 |
| 6,784,015 B1 * | 8/2004 | Hatano et al. ............. 438/75 |
| 6,884,651 B1 * | 4/2005 | Toyoda et al. ............. 438/72 |
| 2001/0022371 A1 * | 9/2001 | Rhodes ................... 257/290 |
| 2003/0127666 A1 * | 7/2003 | Lee ...................... 257/225 |
| 2004/0129990 A1 * | 7/2004 | Lee ...................... 257/428 |

* cited by examiner

*Primary Examiner*—Savitri Mulpuri
(74) *Attorney, Agent, or Firm*—Blakely Sokoloff Taylor & Zafman

(57) ABSTRACT

The present invention relates to a method for fabricating a complementary metal-oxide semiconductor (CMOS) image sensor. Prior to forming an N-type ion implantation region and a first and a second $P^0$-type ion implantation regions, an oxide layer and a nitride layer are sequentially formed on a substrate and are subsequently patterned to form a protective pattern structure with a specific arrangement with respect to a photodiode and a gate structure of a transfer transistor. Afterwards, the gate structure is formed on the substrate. In the existence of the protective pattern structure, an N-type ion implantation process for forming the N-type ion implantation region for use in the photodiode, a first $P^0$-type ion implantation process for forming the first $P^0$-type ion implantation region and a spacer formation process are consecutively performed. A second $P^0$-type ion implantation process for forming the second P0-type ion implantation region is performed thereafter.

11 Claims, 6 Drawing Sheets

METHOD AND FABRICATING COMPLEMENTARY METAL-OXIDE SEMICONDUCTOR IMAGE SENSOR WITH REDUCED ETCH DAMAGE

FIELD OF THE INVENTION

The present invention relates to a complementary metal-oxide semiconductor (CMOS) image sensor; and, more particularly, to a CMOS image sensor with reduced etch damage and improved charge transfer efficiency.

DESCRIPTION OF RELATED ARTS

Generally, an image sensor is a semiconductor device that converts an optical image into an electric signal. Charged coupled devices (CCDs) and complementary metal-oxide semiconductor (CMOS) image sensors are representative types of the image sensor.

In the charge coupled device, metal-oxide semiconductor (MOS) capacitors are closely allocated with each other, and charge carriers are transported and stored into the MOS capacitors. Meanwhile, the CMOS image sensor is a device that adopts a switching mode, wherein outputs are sequentially detected by MOS transistors made with the same number of pixels through employing CMOS technology using a control circuit and a signal processing circuit as a peripheral circuit.

FIG. 1 is a circuit diagram showing a conventional unit pixel including one photodiode and four MOS transistors.

As shown, the unit pixel typically includes one photodiode 100, which is a device for collecting light to generate a photo-generated electric charge, and four transistors such as a transfer transistor 101, a reset transistor 103, a drive transistor 104, and a select transistor 105. In more detail, the transfer transistor 101 serves a role in transferring the photo-generated electric charges collected by the photodiode 100 to a floating diffusion node FD after receiving a signal of Tx transmitted from a gate. The reset transistor 103 sets the floating diffusion node FD with an intended electric potential value after receiving a signal of Rx from a gate and then resets the floating diffusion node FD with an electric potential value by discharging the photo-generated electric charge. The drive transistor 104 serves as a source follower buffer amplifier as receiving a signal of Dx from a gate, and the select transistor 105 selectively outputs the electric potential value corresponding to the photo-generated electric charge after receiving a signal of Sx from a gate. Also, a load transistor 106 for reading an output signal exists outside of the unit pixel.

FIGS. 2A to 2C are cross-sectional views showing mainly a photodiode and a transfer transistor of a conventional CMOS image sensor.

Referring to FIG. 2A, a device isolation layer 12 for defining an active region and a field region is formed in a substrate 11. At this time, the device isolation layer 12 can be formed by employing a local oxidation of silicon method or a shallow trench isolation method. Also, it is possible to use a stacked substrate structure including a substrate with high concentration and an epitaxial layer with low concentration. It is also assumed that the substrate 11 is a P-type.

Next, a gate polysilicon layer and a tungsten silicide layer are consecutively formed on the substrate 11. Then, the gate polysilicon layer and the tungsten silicide layer are patterned to form various types of gate electrodes including a gate electrode 13 of a transfer transistor. Hereinafter, the gate electrode 13 of the transfer transistor will be called a transfer gate.

Afterwards, an N-type ion implantation region 14 for use in a photodiode is formed deeply in the substrate 11 by using an appropriate ion implantation mask. Herein, the N-type ion implantation region 14 is aligned with one side of the transfer gate 13.

Then, with use of the same ion implantation mask employed for forming the N-type ion implantation region 14, a $P^0$-type ion implantation process is carried out to form a $P^0$-type ion implantation region 15 for use in a photodiode between a bottom side of a surface of the substrate 11 and the N-type ion implantation region 14.

A photodiode in a CMOS image sensor is an important device element that determines a characteristic of the CMOS image sensor. If the photodiode is damaged by a defect in a substrate and a subsequent etching process, the characteristic of the CMOS image sensor may become severely degraded.

Especially, defects in the substrate and lattice defects created in a boundary between a device isolation layer and an active region become a dark current source which impairs performance of the CMOS image sensor.

The $P^0$-type ion implantation region 15 shown in FIG. 2A serves a role in improving a device characteristic by offsetting the above mentioned types of defects. Factors for preventing generation of defects are a thickness of the $P^0$-type ion implantation region 15, a doping profile and so on, and these listed factors are also closely related to efficiency on transferring photo-generated electric charges.

After the formation of the $P^0$-type ion implantation region 15, a spacer is typically formed on each sidewall of the transfer gate 13 by performing a blanket etch-back process. At this time, the $P^0$-type ion implantation region 15 is adversely damaged in the course of performing the blanket etch-back process.

In order to solve the problem of the damage to the $P^0$-type ion implantation region 15, there have been proposed various methods. FIGS. 2B and 2C show one proposed conventional method for preventing the $P^0$-type ion implantation region 15 from being damaged. Herein, in these drawings, the same reference numerals are used for those constitution elements identically described in FIG. 2A.

With reference to FIG. 2B, a device isolation layer 12, an N-type ion implantation region 14 and a $P^0$-type ion implantation region 15 are formed by the same process described in FIG. 2A. Thus, detailed description on these device elements will be omitted. After the formation of the $P^0$-type ion implantation region 15, an insulation layer 16 for forming a spacer is formed on the substrate 11 and the transfer gate 13. Then, a photo-sensitive mask 17 formed by using a photo-sensitive layer masks only a photodiode region. This mask formation 17 is different from the precedently described conventional method, wherein an insulation layer for use in a spacer is first formed and is then subjected to a blanket etch-back process to form a spacer. As described above, the immediate application of the blanket etch-back process after the formation of the insulation layer causes the $P^0$-type ion implantation region 15 to be damaged. To solve this problem of the precedent conventional method, the photo-sensitive mask 17 for protecting the photodiode region is formed in this conventional method.

Next, a blanket etch-back process for forming a spacer is performed after the formation of the photo-sensitive mask 17. The result structure obtained after the blanket etch-back process is shown in FIG. 2C.

That is, a typical spacer 18 is formed on one sidewall of the transfer gate 13, i.e., in a floating diffusion region, and a predetermined portion of the insulation layer 16 shown in FIG. 2B remains on the other sidewall of the transfer gate 13, i.e., in the photodiode region, thereby masking a surface of the photodiode. Herein, the remaining predetermined portion of the insulation layer 16 is denoted with a reference numeral 19 and will be referred to as a patterned insulation layer.

That is, because of the photo-sensitive mask 17, the P-type ion implantation region 15 can be protected from the blanket etch-back process for forming the spacer 18.

Subsequently, another $P^0$-type ion implantation process for obtaining an adequate doping profile and desired charge transfer efficiency is performed to complete the formation of a photodiode structure of P/N/P. This $P^0$-type ion implantation process is denoted as a second $P^0$ ion implantation process in FIG. 2C.

In the P/N/P photodiode structure, if a reverse bias is specifically set among the N-type ion implantation region 14 for use in the photodiode, the $P^0$-type ion implantation region 15 and the P-type substrate 11, the N-type ion implantation region 14 for use in the photodiode become fully depleted when an ion implantation concentration of the N-type ion implantation region 14 and that of the $P^0$-type ion implantation region 15 are properly mixed. The full depletion of the N-type ion implantation region 14 starts to be extended to the P-type substrate 11 disposed beneath the N-type ion implantation region 14 and to the $P^0$-type ion implantation region 15 disposed over the N-type ion implantation region 14. At this time, the extension of the full depletion is more vigorous in the P-type substrate 11 because of a relatively low concentration of the P-type substrate 11. Since the depletion region is capable of storing photo-generated electric charges, the depletion region is used for realizing images.

Despite of the advantage described in FIGS. 2B and 2C, this described convention method still is disadvantageous.

First, although it is possible to prevent the photodiode from being damaged during the blanket etch-back process for forming the spacer, a portion of the substrate disposed in the photodiode side can be still damaged in the course of patterning the gate electrodes, e.g., the transfer gate.

Second, it is difficult to obtain an intended doping profile even though said another $P^0$-type ion implantation process for securing the charge transfer efficiency is employed.

FIG. 3 is a diagram showing a doping profile advantageous in the charge transfer with a main focus on a photodiode and a transfer transistor of a conventional CMOS image sensor.

As shown, the charge transfer efficiency is enhanced when a first $P^0$-type ion implantation region 35 formed in a bottom region of a spacer 36 and a second $P^0$-type ion implantation region 37 formed through a second $P^0$-type ion implantation process have different doping concentrations.

That is, the $P^0$-type ion implantation region serves a role in offsetting various defects, and thus, as a concentration of the $P^0$-type ion implantation region highly increases, the $P^0$-type ion implantation region becomes highly capable of offsetting the defects. However, this high doping concentration conversely acts as a potential barrier that decreases efficiency on transferring photo-generated electric charges. As a result, an adequate level of the doping profile is required.

It is an optimally advantageous doping profile for preventing generation of defects and enhancing the charge transfer efficiency that the first $P^0$-type ion implantation region 35 allocated beneath the spacer 36 has a low doping concentration and the second $P^0$-type ion implantation region 36 has a high doping concentration.

However, in the conventional method described in FIG. 2B, the second $P^0$-type ion implantation process is carried out under the state that the patterned insulation layer 19 being made of nitride and having a thick thickness covers a photodiode region. Hence, it is required to apply a high level of energy in order to perform the ion implantation by penetrating the patterned insulation layer 19. As a result of this high energy level, it is difficult to make a delicate control of the doping profile, and this fact results in further difficulty in securing the desired charge transfer efficiency.

Third, the $P^0$-type ion implantation region according to the convention method is formed with a thick thickness in consideration of the lattice defect of the silicon substrate and probable damages caused by the subsequent etching processes.

If the thickness of the $P^0$-type ion implantation region is thick, a capacitance of the photodiode decreases, thereby further decreasing a dynamic range of the CMOS image sensor. Since the $P^0$-type ion implantation region adjacently located in the transfer gate is formed with a thick thickness, the charge transfer efficiency also decreases, thereby deteriorating a characteristic of a dead zone.

Herein, the dynamic range is a maximum range that an output value of an image sensor can change, and the dynamic range can increase when the photodiode capacitance is high. Also, the dead zone is a time interval that a CMOS image sensor is not responsive. In detail, the dead zone is a time interval between a moment that the CMOS image sensor is exposed to a light and a moment that a response to the exposure of the CMOS image sensor to the light is outputted. The smaller dead zone means that the time interval is shorter, further indicating that the response rate of the CMOS image sensor is rapid.

SUMMARY OF THE INVENTION

It is, therefore, an object of the present invention to provide a method for fabricating a complementary metal-oxide semiconductor (CMOS) image sensor capable of preventing degradation of device characteristics caused by damages created from an etching process and of improving a low light level sensitivity by increasing charge transfer efficiency.

In accordance with an aspect of the present invention, there is provided a method for fabricating a complementary metal-oxide semiconductor (CMOS) image sensor, wherein the CMOS image sensor includes a photodiode and a transfer transistor, the method comprising the steps of: forming a protective pattern structure on a substrate provided with a device isolation layer; forming a gate structure of the transfer transistor on the substrate; forming an N-type ion implantation region for use in the photodiode in the substrate disposed in a photodiode region; performing a first $P^0$-type ion implantation process to form a first $P^0$-type ion implantation region between the N-type ion implantation region and a bottom side of a surface of the substrate disposed in the photodiode region; forming a spacer on sidewalls of the gate structure; and performing a second $P^0$-type ion implantation process to the photodiode region, wherein the protective pattern structure being separated with a predetermined distance from each edge of the photodiode and an edge of the gate structure and covering a surface of the photodiode.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a complementary metal-oxide semiconductor (CMOS) image sensor with reduced etch damages in accordance with a preferred embodiment of the present invention will be described in detail with reference to the accompanying drawings, which is set forth hereinafter.

Figure 1:
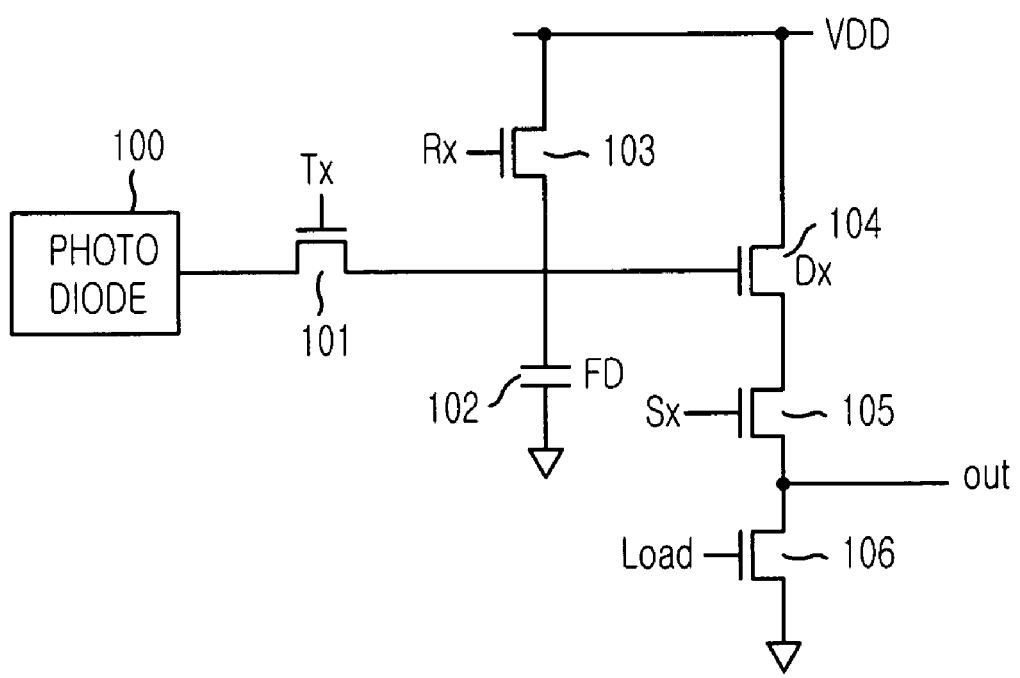
FIG. 1 is a circuit diagram showing a unit pixel of a conventional complementary metal-oxide semiconductor (CMOS) sensor.
Figure 2A:
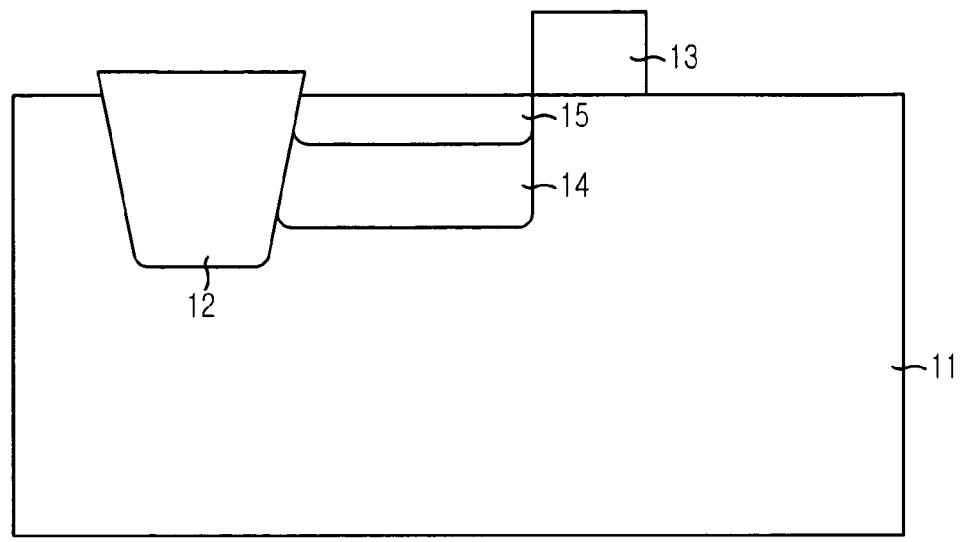
FIGS. 2A to 2C are cross-sectional views illustrating a conventional method for fabricating a CMOS image sensor.
Figure 2B:
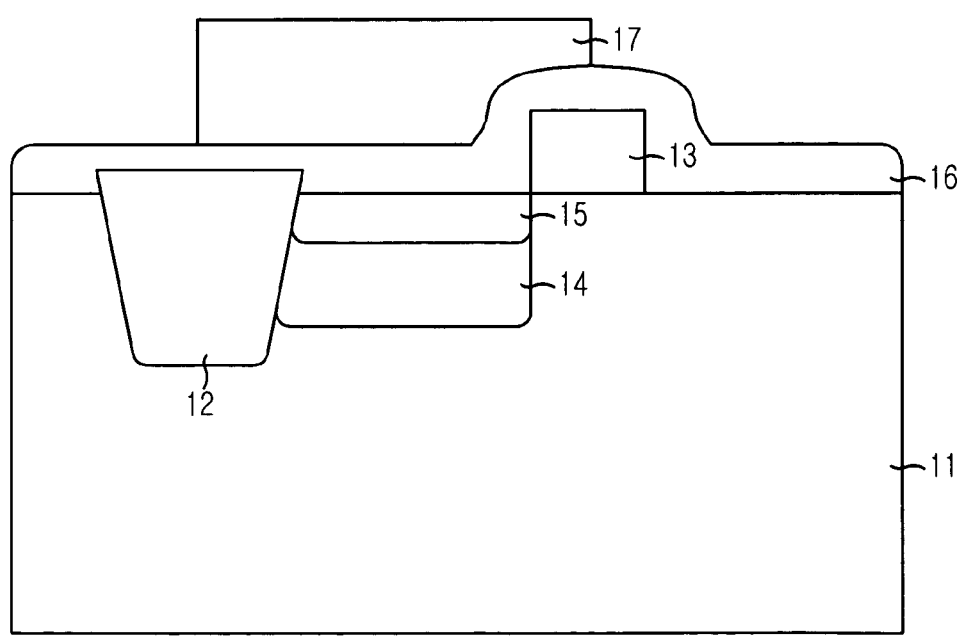
Figure 2C:
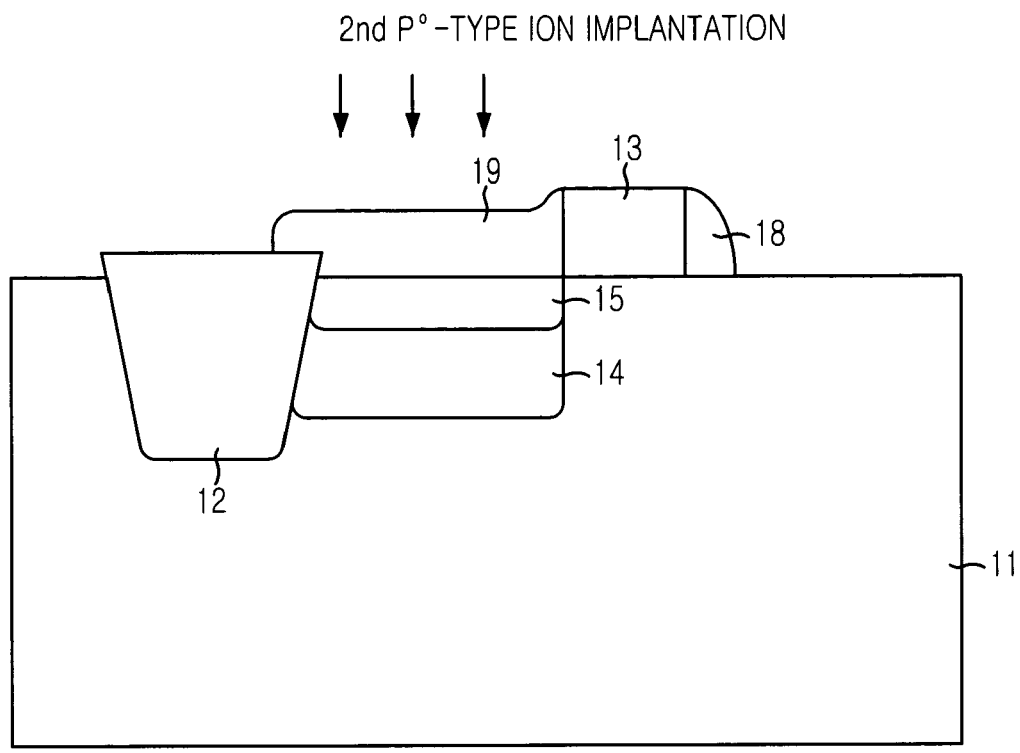
Figure 3:
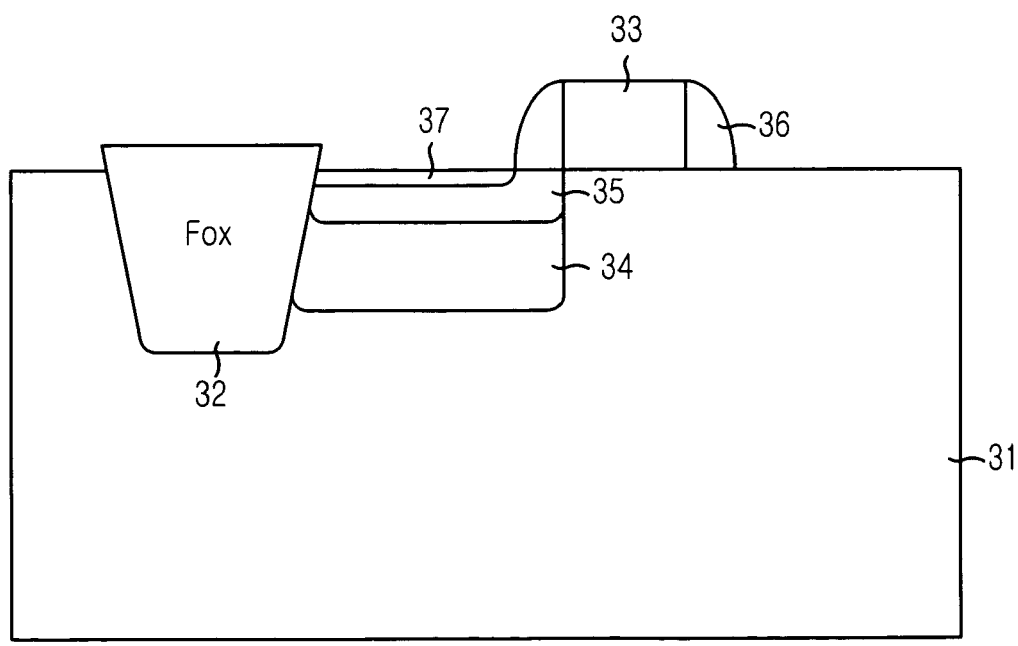
FIG. 3 is a diagram showing a typical doping profile for securing an intended charge transfer efficiency with a main focus on a photodiode and a transfer transistor of a conventional CMOS image sensor.
Figure 4A:
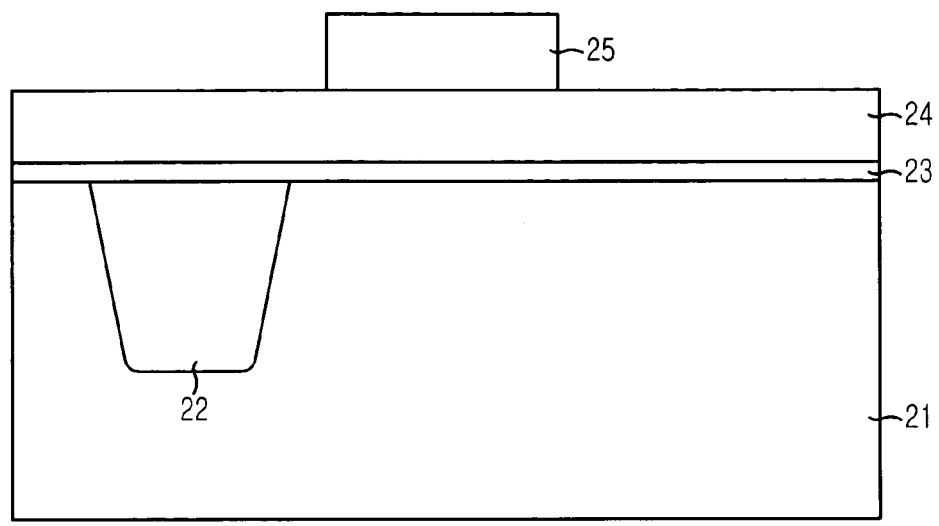
FIG. 4A is a cross-sectional view showing a substrate structure including sequentially stacked oxide and nitride layers for forming a protective pattern structure in a CMOS image sensor in accordance with a preferred embodiment of the present invention.

FIG. 4A is a cross-sectional view showing a substrate structure in a CMOS image sensor in accordance with a preferred embodiment of the present invention.

As shown, a device isolation layer 22 for defining an active region and a field region is formed in a substrate 21. At this time, it is also possible to use a stacked substrate structure including a substrate with high concentration and an epitaxial layer with low concentration.

If the above stacked substrate structure, obtained by forming the epitaxial layer with low concentration on the substrate with high concentration, is employed, a depletion layer of a photodiode formed in the epitaxial layer becomes deeper, thereby increasing capacitance of the photodiode. Also, the use of stacked substrate structure makes it possible to prevent an incidence of cross-talk phenomenon occurring between unit pixels adjacent to the substrate with high concentration.

Herein, the device isolation layer 22 is formed by employing one of local oxidation of silicon method and a shallow trench isolation method.

Although not illustrated, a channel stop ion implantation region encompassing a bottom surface and sidewalls of the device isolation layer 22 is formed by using boron.

Next, an oxide layer 23 is formed on the substrate 21 with a thickness ranging from approximately 100 Å to approximately 200 Å. A nitride layer 24 is then formed on the oxide layer 23 with a thickness ranging from approximately 1500 Å to approximately 2000 Å. Herein, the oxide layer 23 and the nitride layer 24 are patterned to become a protective pattern structure for protecting the photodiode.

At this time, the thickness of the nitride layer 24 is preferably determined by considering a removed thickness of the nitride layer 24 during a subsequent blanket etch-back process for forming a spacer and a depth of a $P^0$-type ion implantation region for use in the photodiode. Also, if a thickness ratio of the oxide layer 23 to the nitride layer 24 is controlled to be in an appropriate level, it is possible to obtain an anti-reflection effect of minimizing reflection of lights incident to the substrate 21.

A first mask 25 based on a photo-sensitive material is formed on the nitride layer 24. The first mask 25 is for patterning the oxide layer 24 and the nitride layer 23.

Figure 4B:
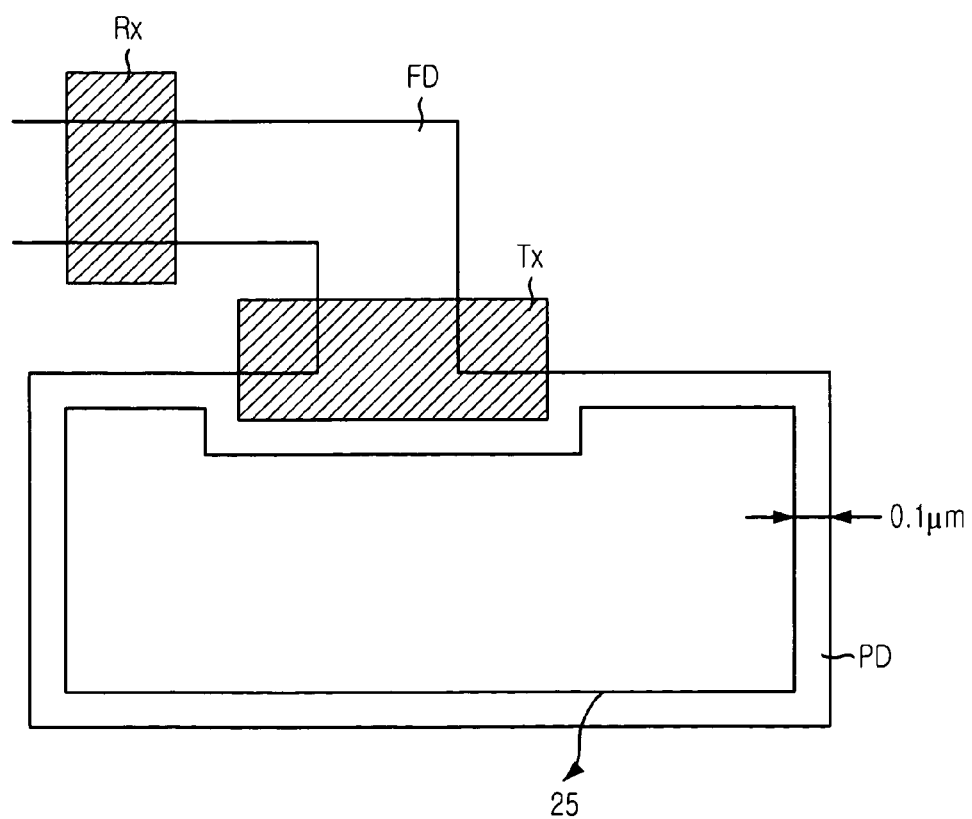
FIG. 4B is a top view showing a unit pixel including a mask for forming the protective pattern structure and other constitution elements of a CMOS image sensor in accordance with the preferred embodiment of the present invention.

FIG. 4B is a top view showing a unit pixel including the first mask 25 and other constitution elements of a CMOS image sensor in accordance with the preferred embodiment of the present invention.

As shown, there is an active region in which a photodiode and diverse junction regions will be formed. The photodiode PD is formed in the squarely shaped active region. Also, a transfer transistor Tx is formed by being contacted to one side of the photodiode PD, and a floating diffusion region FD for receiving photo-generated electric charges from the photodiode PD is formed between a reset transistor Rx and the transfer transistor Tx. Hereinafter, a gate electrode of the transfer transistor Tx will be referred to as a transfer gate.

The first mask 25 masks a photodiode region by being separated with a distance of approximately 0.1 μm from each edge of the photodiode PD and an edge of the transfer gate. In FIG. 4B, the first mask 25, the photodiode PD and the transfer gate are illustrated together to show a precise location of the first mask 25. A patterning process using the first mask 25 is actually carried out prior to forming various types of gates, i.e., the transfer gate and so on, and the photodiode PD. That is, the nitride layer 24 and the oxide layer 23 are patterned with use of the first mask 25, thereby forming a protective pattern structure, and a process for forming various types of gates is performed thereafter. Herein, the protective pattern structure includes a patterned nitride layer 24A and a patterned oxide layer 23A.

Figure 4C:
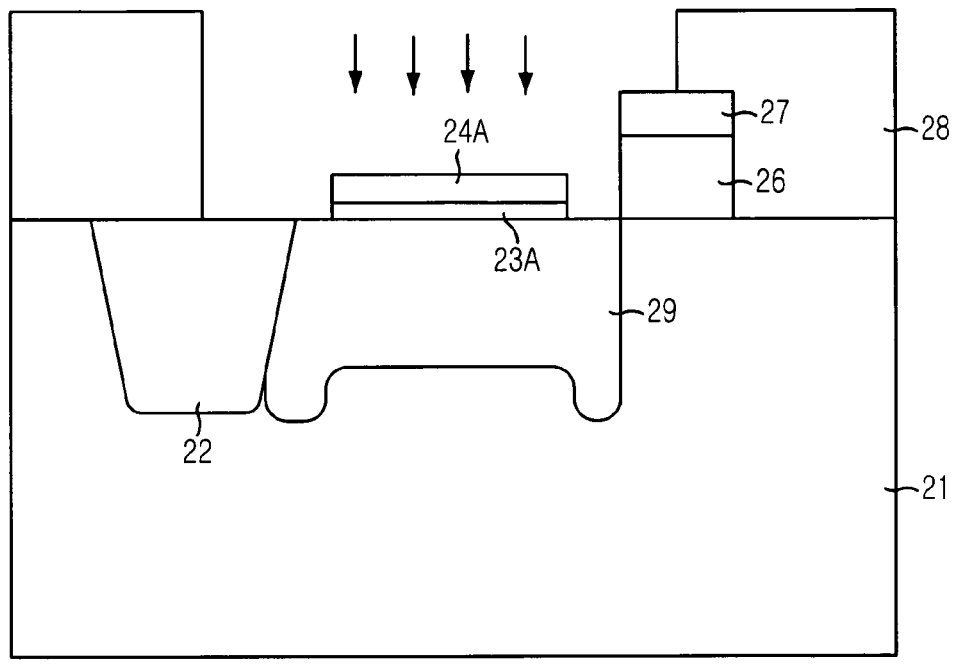
FIG. 4C is a cross-sectional view illustrating processes for forming a gate structure and an N-type ion implantation region in a CMOS image sensor in accordance with the preferred embodiment of the present invention.

FIG. 4C is a cross-sectional view illustrating processes for forming a gate structure and an N-type ion implantation region in accordance with the preferred embodiment of the present invention.

Although not illustrated, a gate oxide layer is first formed on the substrate 21. Then, a gate polysilicon layer and a tungsten silicide layer are sequentially formed on the gate oxide layer. These stacked layers of the gate polysilicon layer and the tungsten silicide layer are patterned by using a second mask 27, thereby forming a gate electrode 26.

Herein, the gate electrode 26 is a transfer gate.

As described above, the protective pattern structure for protecting the photodiode region is formed prior to patterning the gate electrode 26. Thus, this protective pattern structure provides an effect of minimizing damages to a surface of the photodiode PD during an etching process for patterning the gate electrode 26.

If the photodiode PD has a defect due to the above mentioned etch damages, the defect becomes a source of dark current, which subsequently degrades a low light level characteristic of a CMOS image sensor. However, the protective pattern structure formed according to the present invention makes it possible to blocks the photodiode PD from being damaged, thereby further improving characteristics related to dark current of the CMOS image sensor.

Next, an N-type ion implantation mask 28 exposing the photodiode region is formed on predetermined portions of the substrate 21. With use of the N-type ion implantation mask 28, an ion implantation process is carried out to form a deep N-type ion implantation region 29 for use in the photodiode PD in the substrate 21. Herein, the N-type ion implantation region 29 is aligned with an edge of the gate electrode 26.

At this time, the ion implantation process for forming the N-type ion implantation region 29 proceeds by using a dopant of phosphorus-31 ($^{31}P$) or arsenic (As) and energy ranging from approximately 120 KeV to approximately 200 KeV. Since this applied high level of energy for forming the N-type ion implantation region 29 enables ions to penetrate the gate electrode 26.

Because of this penetrability, even though the N-type ion implantation mask 28 is formed, the above ion implantation process for forming the deep N-type ion implantation region 29 is preferably carried out in the existence of the second mask 27 on the gate electrode 26.

The protective pattern structure including the patterned oxide layer 23A and the patterned nitride layer 24A is formed by being separated with a distance of approximately 0.1 μm from an edge of the gate electrode 26, i.e., the transfer gate, and an edge of the device isolation layer 22. Hence, a doping profile of the deep N-type ion implantation region 29 is formed to be in correspondence with this specific arrangement of the protective pattern structure.

Figure 4D:
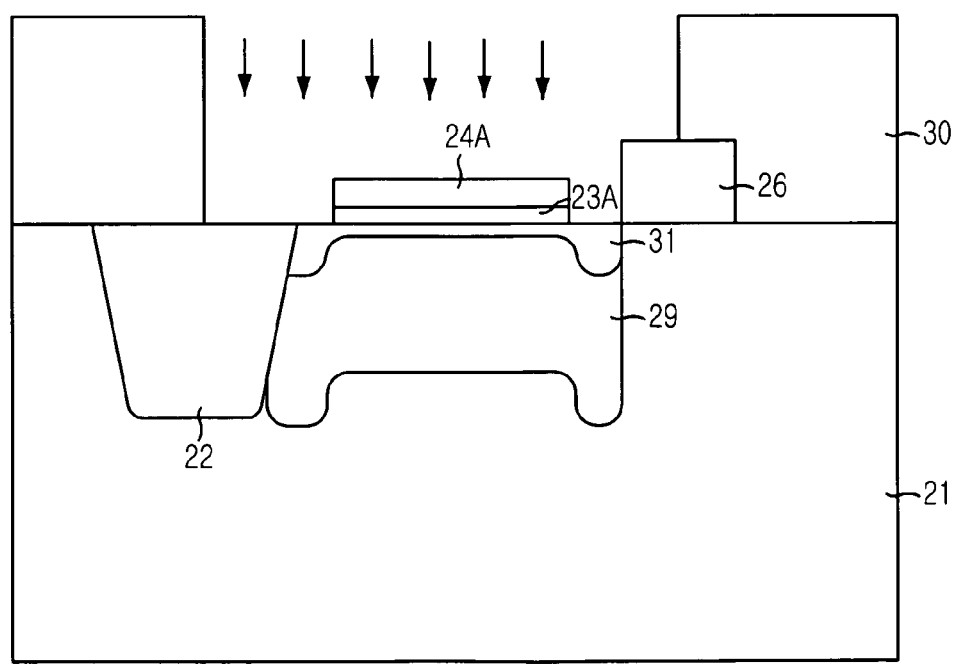
FIG. 4D is a cross-sectional view showing a first $P^0$-type ion implantation region formed in a substrate structure shown in FIG. 4C in accordance with the preferred embodiment of the present invention.

FIG. 4D is a cross-sectional view showing a first $P^0$-type ion implantation region in a substrate structure shown in FIG. 4C in accordance with the preferred embodiment of the present invention.

As shown, the N-type ion implantation mask 28 and the second mask 27 are removed, and then, a first $P^0$-type ion implantation mask 30 is formed in predetermined portions of the substrate 21. A first $P^0$-type ion implantation process proceeds by using the first $p^0$-type ion implantation mask 30 to thereby form a first $P^0$-type ion implantation region 31 between a bottom side of a surface of the substrate 21 and the N-type ion implantation region 29 for use in the photodiode PD.

Since the protective pattern structure is formed with the specific arrangement as described above, portions of the first $P^0$-type ion implantation region 31 formed in the edge of the device isolation layer 22 and that of the gate electrode 26 are formed thickly.

Especially, a portion of the first $P^0$-type ion implantation region 31 formed in the edge of the device isolation layer 22 electrically isolates the photodiode PD and the edge of the device isolation layer 22 from each other. As a result, it is possible to diminish an adverse effect on the photodiode PD caused by the defect generated around the device isolation layer 22.

Also, since the first $P^0$-type ion implantation process proceeds by penetrating the protective pattern structure, the thickness of the nitride layer 24 shown in FIG. 4A should be determined by considering an intended thickness of the $P^0$-type ion implantation region 31.

Figure 4E:
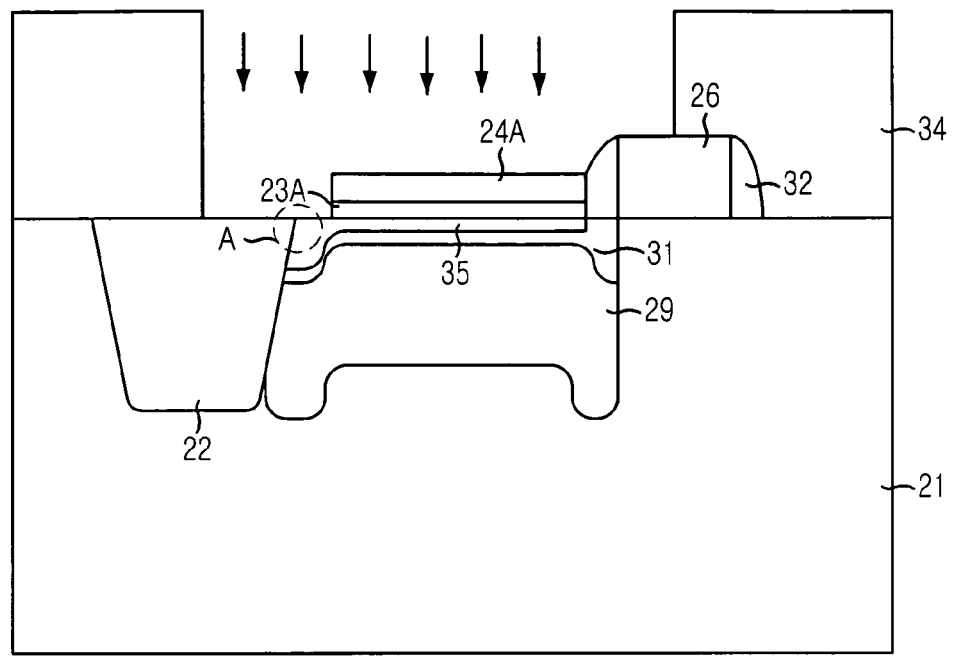
FIG. 4E is a cross-sectional view showing a spacer and a second $P^0$-type ion implantation region formed in a substrate structure shown in FIG. 4D in accordance with the preferred embodiment of the present invention.

FIG. 4E is a cross-sectional view showing a spacer and a second $P^0$-type ion implantation region formed in a substrate structure shown in FIG. 4D in accordance with the preferred embodiment of the present invention.

As shown, the first $P^0$-type ion implantation mask 30 shown in FIG. 4D is removed, and a spacer formation process is performed thereafter. More specific to the spacer formation process, although not illustrated, an insulation layer (not shown) for forming a spacer is formed on an entire surface of the substrate structure obtained after removing the first $P^0$-type ion implantation mask 30. Then, a blanket etch-back process is performed to form a spacer 32. In particular, one part of the spacer 32 has a typical spacer type by being formed on one sidewall of the gate electrode 26, i.e., in a floating diffusion region, while another part of the spacer 32 is formed on the other sidewall of the gate electrode 26, i.e., in the photodiode region, by being connected with the protective pattern structure including the patterned oxide layer 23A and the patterned nitride layer 24A.

During the blanket etch-back process for forming the spacer 32, a portion of the patterned nitride layer 24A is also removed in the course of removing the insulation layer for forming the spacer 32. Therefore, the thickness of the nitride layer 24 shown in FIG. 4A should also be determined by considering the thickness of the patterned nitride layer 24A damaged during the blanket etch-back process.

In accordance with the preferred embodiment of the present invention, the nitride layer 24 shown in FIG. 4A is initially formed with a thickness ranging from approximately 1500 Å to approximately 2000 Å, and the thickness of the patterned nitride layer 24A remaining after the blanket etch-back process is set to be approximately 500 Å with consideration of the damaged thickness of the patterned nitride layer 24A, which is approximately 1000 Å.

After the blanket etch-back process, a second $p^0$-type ion implantation mask 34 is formed on predetermined portions of the substrate 21. Then, a second $P^0$-type ion implantation process is performed by using the second $P^0$-type ion implantation mask 34. Herein, the second $P^0$-type ion implantation process is performed by using a dopant of boron-11 ($^{11}B$) or boron difluoride ($BF_2$) and energy ranging from approximately 30 KeV to approximately 80 KeV. Since a second $P^0$-type ion implantation region 35 is also formed with a thick thickness in the edge of the device isolation layer 22, defects created in the edge region of the device isolation layer 22 and surfaces of the device isolation layer 22 and the substrate 21 can be offset by the second $P^0$-type ion implantation region 35 and the first $p^0$-type ion implantation region 31.

Also, during the second $P^0$-type ion implantation process, the protective pattern structure results in an incidence of soft channeling phenomenon, which leads to a lightened doping concentration of boron in a bottom portion of a channel region of the gate electrode 26.

Figure 5:
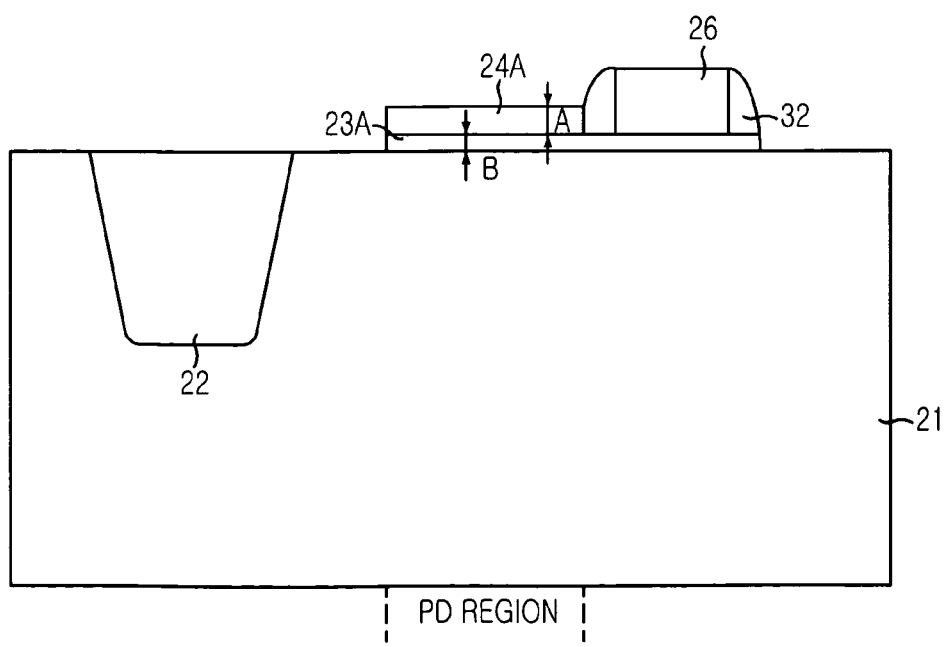
FIG. 5 is a diagram showing an oxide layer and a nitride layer formed in a photodiode region of a CMOS image sensor to demonstrate an anti-reflection effect in accordance with the present invention.

FIG. 5 is a diagram for describing the anti-reflection effect obtained by the preferred embodiment of the present invention. In this drawing, the same reference numerals are also used for the identical constitution elements described in FIGS. 4A to 4E.

As shown, there is a protective pattern structure including a patterned oxide layer 23A and a patterned nitride layer 24A obtained by patterning an oxide layer 23 and a nitride layer 24 sequentially formed in photodiode region. At this time, the anti-reflection effect can be obtained if a ratio of a thickness B of the oxide layer 23 to that A of the nitride layer 24 ranges from approximately 1.3 to approximately 1.5. As a result, it is possible to reduce an amount of disappearing incident lights to the substrate 21.

In case of applying the preferred embodiment of the present invention to a CMOS image sensor, a protective pattern structure is additionally formed on the photodiode. This additionally formed protective pattern structure provides an effect on an improved dark current characteristic obtained by effectively protecting a surface of the photodiode. Also, the protective pattern structure makes it possible to achieve the anti-reflection effect by controlling a thickness ratio of the oxide layer to the nitride layer.

Additionally, the preferred embodiment of the present invention provides further advantages that the surface of the photodiode can be protected against damages created during an etching process as simultaneously as a doping profile of the $P^0$-type ion implantation region can be formed to be advantageous in an effective charge transfer. As a result of these advantages, it is possible to improve a dead zone characteristic of the CMOS image sensor.

The present application contains subject matter related to the Korean patent application No. KR 2004-0032007, filed in the Korean Patent Office on May 6, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a complementary metal-oxide semiconductor (CMOS) image sensor, wherein the CMOS image sensor includes a photodiode and a transfer transistor, the method comprising the steps of:
    forming a protective pattern structure on a substrate provided with a device isolation layer;
    forming a gate structure of the transfer transistor on the substrate;
    forming an N-type ion implantation region for use in the photodiode in the substrate disposed in a photodiode region;
    performing a first $P^0$-type ion implantation process through the protective pattern structure to form a first $P^0$-type ion implantation region between the N-type ion implantation region and a bottom side of a surface of the substrate disposed in the photodiode region;
    forming a spacer on sidewalls of the gate structure; and
    performing a second $P^0$-type ion implantation process through the protective pattern structure to the photodiode region, wherein the protective pattern structure being separated with a predetermined distance from each edge of the photodiode and an edge of the gate structure and covering a surface of the photodiode.

2. The method of claim 1, wherein the step of forming the protective pattern structure includes the steps of:
    sequentially forming an oxide layer and a nitride layer on the substrate; and
    patterning the oxide layer and the nitride layer with use of a first mask.

3. The method of claim 2, wherein the oxide layer is formed with a thickness ranging from approximately 100 Å to approximately 200 Å.

4. The method of claim 2, wherein the nitride layer has a thickness ranging from approximately 1500 Å to approximately 2000 Å.

5. The method of claim 2, wherein a thickness ratio of the oxide layer to the nitride layer is set to be in a range from approximately 1.3 to approximately 1.5 in order to obtain an anti-reflection effect.

6. The method of claim 1, wherein the step of forming the N-type ion implantation region for use in the photodiode proceeds by using a dopant selected from a phosphorus-31 ($^{31}P$) and arsenic (As) and energy ranging from approximately 120 KeV to approximately 200 KeV.

7. The method of claim 6, wherein the step of forming the N-type ion implantation region for use in the photodiode proceeds without removing a second mask used for forming the gate structure.

8. The method of claim 1, wherein the step of performing the second $P^0$-type ion implantation process proceeds by using a dopant selected from boron-11 ($^{11}B$) and boron difluoride ($BF_2$) and energy ranging from approximately 30 KeV to approximately 80 KeV.

9. The method of claim 1, wherein the step of forming the spacer while the protective pattern structure remains includes the steps of:
    forming an insulation layer for forming the spacer on the substrate in the existence of the protective pattern structure; and
    performing a blanket etch-back process to form the spacer of which one part is formed on one sidewall of the gate structure and another part is formed on the other sidewall of the gate structure by being connected with the protective pattern structure.

10. The method of claim 9, wherein the blanket etch-back process continues until the nitride layer of the protective pattern structure is etched with a thickness of approximately 1000 Å.

11. The method of claim 1, wherein the substrate has a stack structure obtained by forming an epitaxial layer with low concentration on a substrate with high concentration.

* * * * *